US008750660B2

(12) United States Patent
Levy et al.

(10) Patent No.: US 8,750,660 B2
(45) Date of Patent: Jun. 10, 2014

(54) INTEGRATED OPTICAL INTERCONNECT

(75) Inventors: Shmuel Levy, Kiryat Tivon (IL); Shai Cohen, Haifa (IL); Shai Rephaeli, Kiryat Tivon (IL); Eyal Babish, Zichron Yaakov (IL); Ronnen Lovinger, Tel Aviv (IL)

(73) Assignee: Mellanox Technologies Ltd., Yokneam (IL)

( * ) Notice: Subject to any disclaimer, the term of this patent is extended or adjusted under 35 U.S.C. 154(b) by 198 days.

(21) Appl. No.: 13/369,324

(22) Filed: Feb. 9, 2012

(65) Prior Publication Data
US 2013/0209025 A1    Aug. 15, 2013

(51) Int. Cl.
*G02B 6/30* (2006.01)

(52) U.S. Cl.
USPC .......................................................... 385/49

(58) Field of Classification Search
USPC .......................................................... 385/49
See application file for complete search history.

(56) References Cited

U.S. PATENT DOCUMENTS

| 4,130,343 | A | * | 12/1978 | Miller et al. .................... 385/49 |
| 4,337,759 | A | | 7/1982 | Popovich et al. |
| 4,979,787 | A | | 12/1990 | Lichtenberger |
| 5,073,003 | A | * | 12/1991 | Clark ............................. 385/33 |
| 5,404,869 | A | | 4/1995 | Parkyn, Jr. et al. |
| 5,917,976 | A | | 6/1999 | Yamaguchi |
| 6,132,107 | A | * | 10/2000 | Morikawa ...................... 385/89 |
| 6,456,766 | B1 | | 9/2002 | Shaw et al. |
| 6,491,447 | B2 | * | 12/2002 | Aihara ............................ 385/92 |
| 6,567,574 | B1 | | 5/2003 | Ma et al. |
| 6,635,866 | B2 | | 10/2003 | Chan et al. |
| 6,697,399 | B2 | | 2/2004 | Kimura et al. |
| 6,721,187 | B2 | | 4/2004 | Hall et al. |
| 6,741,777 | B2 | | 5/2004 | Jewell et al. |
| 6,817,782 | B2 | | 11/2004 | Togami et al. |
| 7,040,814 | B2 | | 5/2006 | Morimoto et al. |
| 7,049,704 | B2 | | 5/2006 | Chakravorty et al. |
| 7,267,553 | B2 | | 9/2007 | Sone |
| 7,289,701 | B2 | * | 10/2007 | Lam et al. ....................... 385/49 |
| 7,350,985 | B2 | | 4/2008 | Laughlin et al. |
| 7,515,415 | B2 | | 4/2009 | Monfarad et al. |
| 7,538,358 | B2 | | 5/2009 | Badehi et al. |
| 7,665,911 | B2 | | 2/2010 | Hamazaki |
| 8,043,877 | B2 | | 10/2011 | Badehi et al. |
| 8,115,302 | B2 | | 2/2012 | Andry et al. |
| 8,144,473 | B2 | | 3/2012 | Yumoto et al. |
| 8,272,788 | B2 | | 9/2012 | Ohta |
| 8,315,287 | B1 | * | 11/2012 | Roggero et al. ........... 372/50.11 |
| 2006/0008214 | A1 | | 1/2006 | Giboney et al. |

(Continued)

OTHER PUBLICATIONS

International Electrotechnical Commision, "Fiber Optic Connector Interfaces—Part 5: Type MT Connector Family", IEC document No. IEC61754-5, second edition, 32 pages, Jul. 2005.

(Continued)

*Primary Examiner* — Sung Pak
(74) *Attorney, Agent, or Firm* — D. Kligler I.P. Services Ltd.

(57) ABSTRACT

A method for fabricating an integrated optical interconnect includes disposing a layer over a substrate on which at least one optoelectronic transducer has been formed. A groove is formed in the layer in alignment with the optoelectronic transducer. A slanted mirror is formed in the layer at an end of the groove adjacent to the optoelectronic transducer to direct light between the optoelectronic transducer and an optical fiber placed in the groove.

22 Claims, 3 Drawing Sheets

(56) References Cited

U.S. PATENT DOCUMENTS

| | | |
|---|---|---|
| 2008/0031629 A1 | 2/2008 | Nguyen et al. |
| 2012/0051685 A1 | 3/2012 | Su et al. |
| 2012/0224814 A1 | 9/2012 | Hirano et al. |
| 2013/0156386 A1 | 6/2013 | Miller |

OTHER PUBLICATIONS

Lagziel et al., U.S. Appl. No. 13/851,178, filed Mar. 27, 2012.
Levy et al., U.S. Appl. No. 13/677,374, filed Nov. 15, 2012.
Levy et al., U.S. Appl. No. 13/731,025, filed Dec. 30, 2012.
Stockham et al., "Assembly of micro-optical systems with mechanical positioning", Proceedings of the SPIE, Optomechatronic Micro/Nano Devices and Components II, 637609, Oct. 13, 2006.
U.S. Appl. No. 13/366,326, filed Feb 5, 2012.
U.S. Appl. No. 13/419,447, filed Mar. 14, 2012.
U.S. Appl. No. 13/419,449, filed Mar. 14, 2012.
U.S. Appl. No. 13/481,874, filed May 28, 2012.
U.S. Appl. No. 13/532,829, filed Jun. 26, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
U.S. Appl. No. 13/532,829 Office Action dated Oct. 4, 2013.
U.S. Appl. No. 13/366,326 Office Action dated Oct. 25, 2013.
U.S. Appl. No. 13/366,326 Office Action dated Mar. 27, 2014.
U.S. Appl. No. 13/731,025 Office Action dated Mar. 20, 2014.
U.S. Appl. No. 13/677,374 Office Action dated Jan. 30, 2014.

* cited by examiner

INTEGRATED OPTICAL INTERCONNECT

FIELD OF THE INVENTION

The present invention relates generally to optical communication, and particularly to integrated optical interconnects.

BACKGROUND OF THE INVENTION

Optical modules integrating optical fibers with optoelectronic transducers, such as semiconductor lasers and photodiodes, are utilized, for example, in high data rate, high bandwidth communication systems. These modules are fabricated using a variety of hybrid assembly techniques, which sometimes require high precision alignment processes when directing the light in the optical fiber core to the optoelectronic transducer.

SUMMARY OF THE INVENTION

An embodiment that is described herein provides a method for fabricating an integrated optical interconnect. The method includes disposing a layer over a substrate on which at least one optoelectronic transducer has been formed. A groove is formed in the layer in alignment with the optoelectronic transducer. A slanted mirror is formed in the layer at an end of the groove adjacent to the optoelectronic transducer to direct light between the optoelectronic transducer and an optical fiber placed in the groove.

In some embodiments, the at least one optoelectronic transducer includes an array of multiple optoelectronic transducers, forming the groove includes forming multiple grooves in alignment with the respective optoelectronic transducers, and forming the slanted mirror includes forming multiple slanted mirrors at respective ends of the grooves in alignment with the respective optoelectronic transducers.

In another embodiment, disposing the layer includes disposing a Gallium Arsenide (GaAs) layer. In yet another embodiment, disposing the layer includes fabricating the layer using a GaAs fabrication process that is also used for forming the optoelectronic transducer. In other embodiments, the substrate includes a semiconductor wafer, and disposition of the layer and forming of the groove and the mirror are performed on the wafer prior to dicing the wafer into multiple dies, each including at least one integrated optical interconnect. In some embodiments, prior to dicing the wafer the method also includes testing the optoelectronic transducer.

In some embodiments, the at least one optoelectronic transducer includes a vertical cavity surface emitting laser (VCSEL). In other embodiments, the at least one optoelectronic transducer includes a photodetector. In yet other embodiments, disposing the layer includes disposing a polymer layer.

In some embodiments, forming the slanted mirror includes cutting the layer at a bevel. In other embodiments, forming the slanted mirror includes disposing a lens on a surface of the slanted mirror.

There is additionally provided, in accordance with an embodiment that is described herein, an integrated optical interconnect, including a substrate on which at least one optoelectronic transducer has been formed. A layer is disposed on the substrate. A groove is formed in the layer in alignment with the optoelectronic transducer for placing an optical fiber, and a slanted mirror is formed in the layer at an end of the groove adjacent to the optoelectronic transducer, so as to direct light between the optoelectronic transducer and the optical fiber placed in the groove.

There is additionally provided, in accordance with an embodiment that is described herein, an optical engine, including an optical fiber and an integrated optical interconnect. The integrated optical interconnect includes a substrate on which at least one optoelectronic transducer has been formed, a layer disposed on the substrate, a groove formed in the layer in alignment with the optoelectronic transducer for placing the optical fiber, and a slanted mirror formed in the layer at an end of the groove adjacent to the optoelectronic transducer, so as to direct light between the optoelectronic transducer and the optical fiber placed in the groove.

The present invention will be more fully understood from the following detailed description of the embodiments thereof, taken together with the drawings in which:

DETAILED DESCRIPTION OF EMBODIMENTS

Overview

Network communication systems, such as Infiniband, can comprise optoelectronic-based connectivity or switching components, such Enhanced Data Rate (EDR) active optical cables, EDR optical module switches, and EDR Host Channel Adapter (HCA) optical modules. These optical components comprise optical engines, which are often regarded as the lowest hierarchical optical building blocks, comprising an optical fiber array which is interfaced to an optoelectronic transducer array. Optoelectronics transducers may comprise, for example, lasers to generate light and photodetectors to detect light, which is routed in optical fibers between the elements of the communication system.

Embodiments of the present invention that are described herein provide improved optical engines and methods for fabricating such engines. In the embodiments of the present invention, optical engines are formed by first disposing a layer on a semiconductor wafer substrate comprising optoelectronic transducers. The optoelectronic transducers may comprise Vertical Cavity Surface Emitting Lasers (VCSEL) and/or photodetectors (PD), for example, whose metal contacts are exposed by etching before disposing the layer. Grooves such as V-grooves are etched into the disposed layer at predefined positions in alignment with the optoelectronic transducers. The substrate is then cut at the end of the V-groove and coated with an appropriate reflecting layer on a bevel to form a slanted mirror, which is configured to direct light between the optoelectronic transducer and an optical fiber placed in the V-groove.

This wafer scale, self-aligning optical interconnect fabrication method described herein, when used in the manufacturing of optical engines, eliminates many high cost assembly steps and increases manufacturing yield. For example, in some embodiments, the optoelectronic transducers and the disposed layer are fabricated using the same process, e.g., a Gallium Arsenide (GaAs) process.

Optical Engine Fabrication

Figure 1:
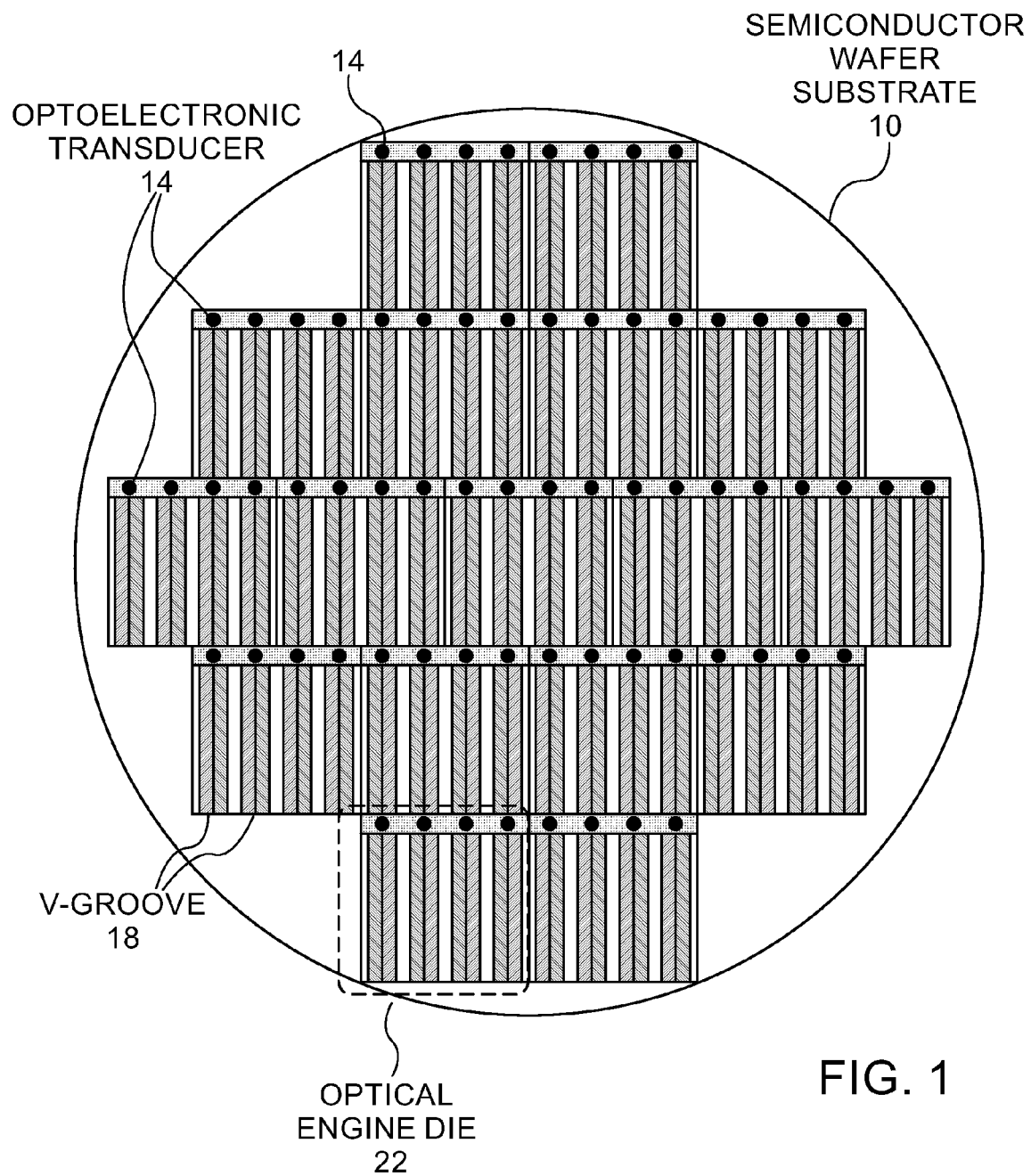
FIG. 1 is a top view of a semiconductor wafer comprising optical engine dies, in accordance with an embodiment of the present invention.

FIG. 1 is a top view of optical engine dies 22 fabricated directly on a semiconductor wafer substrate 10, in accordance with an embodiment of the present invention. Optoelectronics transducers 14 comprising either VCSEL or PD device arrays are fabricated on semiconductor wafer substrate 10 leaving white areas adjacent the optoelectronic transducer arrays to allow space for the fabrication of the slanted mirror and V-groove structures as will be described later. The dimensions of the VCSEL and PD devices in the present example are 250 µm by 250 µm. Alternatively, transducers 14 may comprise any other suitable type of optoelectronic transducer of any suitable size.

In some embodiments, Gallium Arsenide (GaAs) and Aluminum Gallium Arsenide (AlGaAs) quantum well layers are epitaxially grown on a GaAs substrate body to form the VCSEL device by fabrication processes, such as molecular beam epitaxy (MBE). Photodetector devices may be fabricated on the semiconductor wafer substrate by similar methods. In the embodiments of the present invention, either photodetector or VCSEL devices are fabricated on a single semiconductor wafer substrate during a particular run. The VCSEL and PD array fabrication techniques described herein are given for conceptual clarity, and not by way of limitation. In alternative embodiments, other suitable fabrication technique can be used.

In some embodiments, for example, semiconductor wafer substrate 10 may comprise a Silicon wafer on which the GaAs/AlGaAs epitaxial layers are grown to form the optoelectronic transducers. In other embodiments, the epitaxial layers may comprise Indium Gallium arsenide (InGaAs). In other embodiments, fabrication process techniques may enable an array of both PD and VCSEL devices to be formed on the same semiconductor wafer substrate.

In accordance with the embodiments of the present invention, disposing another layer on semiconductor wafer substrate 10 above the optoelectronic transducers is the first step in forming the self-aligned, integrated optical interconnect between the fiber and optical transducer for fabricating optical engines. V-grooves 18 are then etched into the layer. In the embodiment shown in FIG. 1, four V-grooves integrated with four optoelectronic transducers will be diced out of the wafer to create an optical engine die 22, which is the building block of the optical engine. In the present embodiment, dimensions of the diced optical engine die are 1 mm by 1 mm, although any other suitable dimensions can be used. In alternative embodiments, each optical engine die may comprise any suitable number of optical transducers and corresponding V-grooves, or even a single transducer and groove.

Figure 2A:
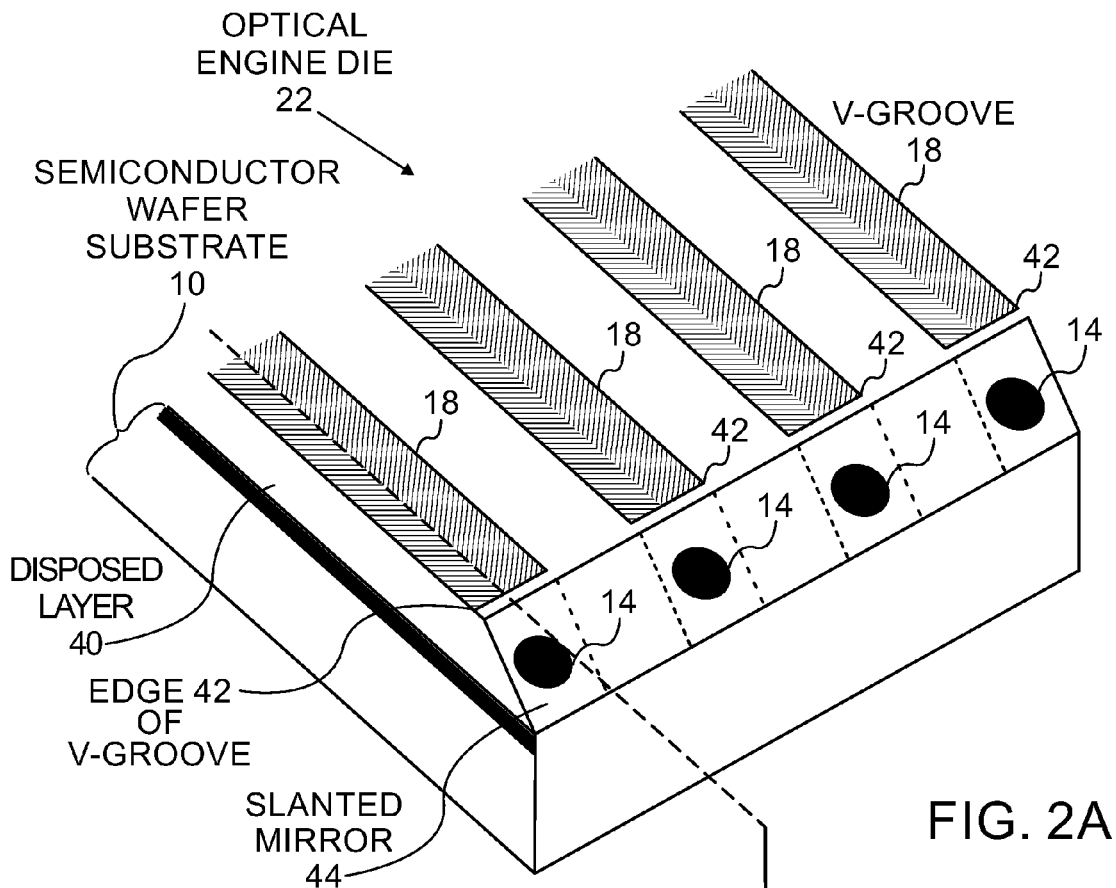
FIGS. 2A and 2B are isometric and cross-sectional views illustrating the structure of optical engines, in accordance with an embodiment of the present invention.
Figure 2B:
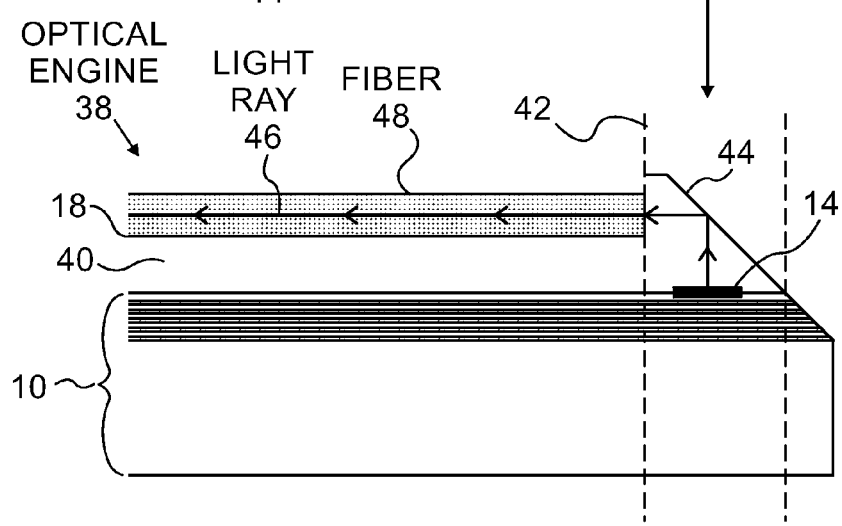

FIGS. 2A and 2B are isometric and cross-sectional views illustrating the structure of optical engines, in accordance with an embodiment of the present invention. FIG. 2A shows an isometric view of optical engine die 22 and FIG. 2B shows the cross-section of an optical engine 38. In the present embodiment, a disposed layer 40 comprises a GaAs layer with a typical thickness of 500 µm that can be bonded or epitaxially grown onto the substrate comprising the optoelectronic transducer array, which is given by way of example. In some embodiments, layer 40 is disposed on substrate 10 using the same GaAs process that disposes transducers 14.

V-grooves 18 are etched into disposed layer 40 at a predefined position wherein an edge 42 of the V-groove ends just above the region near to the edge of the optoelectronic transducer below, and the predefined position is configured to minimize optical losses within the integrated optical interconnect. Each optoelectronic transducer, and particularly the optoelectronic transducers, can be tested using an external photodetector or external laser configured to travel over each optoelectronic transducer 14 fabricated below disposed layer 40 on substrate 10.

In the next step, the wafer is cut on a bevel to create a 45 degree slanted mirror 44 as shown in FIG. 2A. Alternatively, however, mirror 44 may be slanted at any other suitable angle to direct light between the optical fiber and the corresponding optoelectronic transducer. In some embodiments, the bevel cut can be implemented using a mechanical saw. In other embodiments, the bevel cut can be implemented by etching processes, such as reactive ion etching and the like. Further alternatively, the bevel cut can be implemented using any other suitable process.

The wafer is further diced to create multiple optical engine dies 22, each comprising four V-grooves 18 with four corresponding optoelectronic transducers 14 as shown in FIG. 2A. Optical engine 38 is formed by placing and gluing an optical fiber 48 with a cleaved edge in each V-groove 18 of optical engine die 22 as shown in FIG. 2B. Slanted mirror 44 is configured to minimize the optical losses in directing a light ray 46 between the optoelectronic transducer and the core of optical fiber with a cleaved edge, to form the self-aligned integrated optical interconnect shown in FIG. 2B. The optoelectronic transducers comprised in the diced optical engine dies are tested for functionality using the optical fiber glued to the V-groove.

In some embodiments, a thin layer of gold is disposed on slanted mirror 44 to improve the total internal reflectivity and to reduce the optical loss of the light directed between the optoelectronic transducer and optical fiber. In some embodiments, optical engine 38 comprises a lens (not shown in the figures), which is formed on the surface of slanted mirror 44. The lens may be fabricated using any suitable technology, for example total internal reflection (TIR) lens technology. TIR lens are described, for example, in U.S. Pat. Nos. 4,337,759 and 5,404,869, whose disclosures are incorporated herein by reference.

In other embodiments, disposed layer 40 comprises disposing a polymer layer. The slanted mirror is formed by a bevel cut or bevel etching of the polymer layer. Examples of the material properties and processing techniques of polymer material comprising disposed layer 40 are described, for example, by Eldada and Shacklette, in "Advances in Polymer Integrated Optics," IEEE Journal of Selected Topics in Quantum Electronics, volume 6, no. 1, January/February, 2000, pages 54-68, which is incorporated herein by reference. Further alternatively, layer 40 may comprise any other suitable material.

Figure 3:
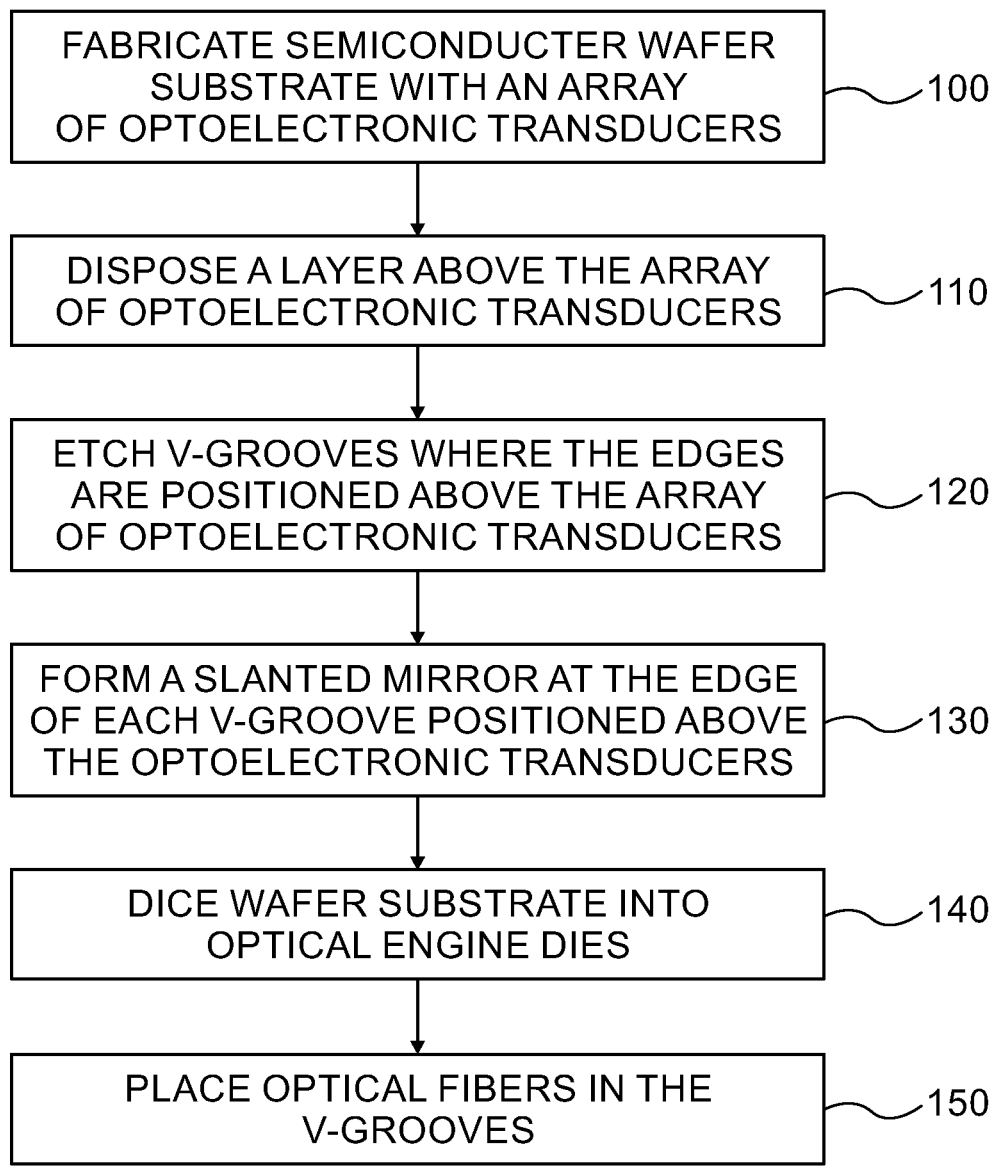
FIG. 3 is a flow chart that schematically illustrates a method for fabricating optical engines, in accordance with an embodiment of the present invention.

FIG. 3 is a flow chart that schematically illustrates a method for fabricating optical engines 38, in accordance with an embodiment of the present invention. An array of optoelectronic transducers 14 are fabricated on semiconductor wafer substrate 10, at a fabrication step 100. At a disposition step 110, disposed layer 40 is disposed above the optoelectronic transducer array. At an etching step 120, V-grooves 18 are etched into disposed layer 40 where edges 42 of the V-grooves are positioned above the array of optoelectronic transducers 14.

At a formation step 130, slanted mirror 44 is formed at edge 42 of each V-groove 18 positioned above each optoelectronic transducer 14. At a dicing step 140, the wafer is diced into separate optical engine dies 22. Finally at a placement step 150, optical fibers 48 are placed in V-grooves 18 to form optical engine 38. In some embodiments, optical engine 38 comprises both VCSEL and PD-based optical engine dies integrated with a single optical fiber bundle. The separated diced VCSEL and PD-based optical engine dies are typically bonded side-by-side to another substrate before the optical fibers are placed in the V-grooves.

Although the embodiments described herein mainly relate to the fabrication of optical engines, the methods and systems described herein can also be used in other applications, wherein self-aligned, integrated optical interconnects are required for different optical system applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for fabricating an integrated optical interconnect, the method comprising:
    disposing a layer over a semiconductor wafer substrate on which a plurality of optoelectronic transducers have been formed;
    forming respective grooves in the layer in alignment with a plurality of the optoelectronic transducers;
    forming a slanted mirror in the layer at an end of each groove adjacent to the respective optoelectronic transducer to direct light between the optoelectronic transducer and an optical fiber placed in the groove; and
    dicing the semiconductor wafer, after disposing the layer and forming the grooves and slanted mirrors, to create multiple engine dies, each including one or more optoelectronic transducers and respective grooves and mirrors.

2. The method according to claim 1, wherein disposing the layer comprises disposing a Gallium Arsenide (GaAs) layer.

3. The method according to claim 2, wherein disposing the layer comprises fabricating the layer using GaAs fabrication process that is also used for forming the optoelectronic transducer.

4. The method according to claim 1, and comprising testing the optoelectronic transducer prior to dicing the wafer.

5. The method according to claim 1, wherein the optoelectronic transducers comprise vertical cavity surface emitting lasers (VCSELs).

6. The method according to claim 1, wherein the optoelectronic transducers comprise photodetectors.

7. The method according to claim 1, wherein disposing the layer comprises disposing a polymer layer.

8. The method according to claim 1, wherein forming the slanted mirror comprises cutting the layer at a bevel.

9. The method according to claim 1, wherein forming the slanted mirror comprises disposing a lens on a surface of each slanted mirror, prior to dicing the semiconductor wafer.

10. An integrated optical interconnect, comprising:
    a semiconductor wafer substrate on which a plurality of optoelectronic transducers have been formed; and
    a layer disposed on the semiconductor wafer substrate, the layer including:
        grooves, which are formed in the layer in alignment with respective optoelectronic transducers, for placing optical fibers; and
        respective slanted mirrors, which are formed in the layer at ends of the grooves, adjacent to the respective optoelectronic transducers, so as to direct light between the respective optoelectronic transducers and the optical fibers placed in the grooves,
    wherein the layer is bonded to or epitaxially grown on the semiconductor wafer substrate.

11. The optical interconnect according to claim 10, wherein the layer comprises a Gallium Arsenide (GaAs) layer.

12. The optical interconnect according to claim 11, wherein the layer is fabricated using a GaAs fabrication process that is also used for forming the optoelectronic transducer.

13. The optical interconnect according to claim 10, wherein the optoelectronic transducers comprise vertical cavity surface emitting lasers (VCSELs).

14. The optical interconnect according to claim 10, wherein the optoelectronic transducers comprise photodetectors.

15. The optical interconnect according to claim 10, wherein the layer comprises a polymer layer.

16. The optical interconnect according to claim 10, and comprising lenses disposed on a surface of each of the slanted mirrors.

17. The method according to claim 1, wherein the optoelectronic transducers comprise both VCSELs and photodetectors.

18. The method according to claim 1, wherein disposing the layer comprises bonding the layer to the substrate.

19. The method according to claim 1, wherein disposing the layer comprises epitaxially growing the layer onto the substrate.

20. The method according to claim 8, wherein cutting the layer at a bevel comprises cutting by an etching process.

21. The method according to claim 8, wherein cutting the layer at a bevel comprises cutting by a mechanical saw.

22. The method according to claim 1, wherein forming the slanted mirror comprises disposing a thin layer of gold on a surface of each slanted mirror, prior to dicing the semiconductor wafer.

* * * * *